United States Patent [19]

Fukuda

[11] Patent Number: 5,098,736
[45] Date of Patent: Mar. 24, 1992

[54] METHOD FOR PREPARING ELECTROPHOTOGRAPHIC PHOTORECEPTOR

[75] Inventor: Yuzuru Fukuda, Kanagawa, Japan

[73] Assignee: Fuji Xerox Co., Ltd., Tokyo, Japan

[21] Appl. No.: 293,022

[22] Filed: Jan. 3, 1989

[30] Foreign Application Priority Data

Jan. 7, 1988 [JP] Japan .................................. 63-728

[51] Int. Cl.$^5$ ...................... C23C 16/50; C23C 14/32; B05D 5/12
[52] U.S. Cl. .......................... 427/39; 427/39; 204/192.31; 430/84
[58] Field of Search ............... 427/38, 39; 204/192.31; 430/84

[56] References Cited

U.S. PATENT DOCUMENTS

| | | | |
|---|---|---|---|
| 4,378,417 | 3/1983 | Maruyama et al. | 204/192.31 |
| 4,403,026 | 9/1983 | Shimizu et al. | 430/65 |
| 4,634,600 | 1/1987 | Shimizu et al. | 204/192.31 |

Primary Examiner—Norman Morganstern
Assistant Examiner—Margaret Bueker
Attorney, Agent, or Firm—Finnegan, Henderson, Farabow, Garrett and Dunner

[57] ABSTRACT

A method for preparing an electrophotographic photoreceptor comprising the steps of either forming a charge transporting layer comprising aluminum oxide and then forming a charge generating layer having amorphous silicon as the principal component, or forming a charge generating layer having amorphous silicon as the principal component and then forming a charge transporting layer comprising aluminum oxide. The charge transporting layer is formed by means of an ion assisted deposition method.

8 Claims, 2 Drawing Sheets

METHOD FOR PREPARING ELECTROPHOTOGRAPHIC PHOTORECEPTOR

FIELD OF THE INVENTION

The present invention relates to a method for manufacturing electrophotographic photoreceptors having an electrical charge transporting layer consisting of aluminium oxide.

BACKGROUND OF THE INVENTION

In recent years, the so-called amorphous silicon electrophotographic photoreceptor having a layer whose principal component is amorphous silicon as the photosensitive layer has been the subject of attention. This is because the amorphous silicon material has the potential of fundamentally improving the life factors of the conventional electrophotographic photoreceptors, and its application to an electrophotographic photoreceptor makes it possible to obtain a sufficiently hard, thermally stable and long-lived electrophotographic photoreceptor with electrically stabilized reproducibility. Consequently, there have been proposed various kinds of amorphous-silicon-based electrophotographic photoreceptors.

Of these, an amorphous electrophotographic photoreceptor having the so-called separated function type photosensitive layer in which the photosensitive layer is separated into a charge generating layer generates electric charge carriers under the irradiation of light and a charge transporting layer which permits an efficient injection of the charge carriers generated in the charge generating layer and an efficient movement of the charge carriers, has been proposed as an excellent photoreceptor. As the charge transporting layer for such a separated function type amorphous silicon electrophotographic photoreceptors use has been made, for example, of a layer obtained by decomposing a gaseous mixture in glow discharge. The mixture comprises a gaseous silane compound such as silane or disilane, a gas containing carbon, oxygen or nitrogen, and a gas containing a trace of group III or group V elements (for example, phosphine or diborane) to form an amorphous silicon film containing the above-mentioned elements to a thickness in the range of 5-100 µm.

In general, in an electrophotographic photoreceptor that is functionally separated into a charge transporting layer and a charge generating layer, its charging property is affected by the characteristics of the charge transporting layer, which has a thickness that is the largest among the various layers in the photosensitive layer. However, the chargeability of the electrophotographic photoreceptor using a charge transporting layer of hydrogenated amorphous silicon film obtained by the glow-discharge decomposition of a silane compound as exemplified above is still at an insufficient by low level on the order of about 30 V/µm or smaller. Further, its rate of dark decay, although different depending upon the conditions of use, is in general at least about 20%/sec, which is extremely high. For this reason, an electrophotographic photoreceptor using such an amorphous-silicon-based charge transporting layer was either limited in its use to systems with relatively fast operation or required a specific developing system bceause it is not possible to obtain a sufficiently high charge potential. In order to raise the charge potential, the thickness of the charge transporting layer may be increased. However, this leads to an extremely high cost for the photoreceptor by requiring an increase in the manufacturing time, and further by the induced reduction of the gain in the ordinary manufacturing method due to the increase in the probability of generating film defects accompanying the manufacture of thick films.

The applicants of the present invention had previously proposed an electrophotographic photoreceptor that uses an aluminum oxide film as a charge transporting layer. However, it was later found in this electrophotographic photoreceptor that there are sometimes cases in which cracks are generated in the charge transporting layer. When cracks are generated in the charge transporting layer, the charging properties of the electrophotographic photoreceptor becomes nonuniform, which leads to the impossibility of obtaining pictures of satisfactory quality. With a further investigation at that point, the applicants discovered that when an aluminum oxide film is formed by a specific method of manufacture according to the present invention, no cracks occurred in the aluminum oxide film.

SUMMARY OF THE INVENTION

Accordingly, an object of the present invention is a method for manufacturing an electrophotographic photoreceptor using an aluminum oxide film as a charge transporting layer which will not generate cracks in the charge transporting layer.

This and other objects of the present invention are accomplished by a method for manufacturing an electrophotographic photoreceptor including the formation on a substrate, either a charge transporting layer comprising aluminum oxide and then a charge generating layer having amorphous silicon as the principal component, or a charge generating layer having amorphous silicon as the principal component and then a charge transporting layer comprising aluminum oxide. The charge transporting layer is formed by an ion assisted deposition method.

BRIEF DESCRIPTION OF THE DRAWING

The manner by which the above objects and other objects, features, and advantages of the present invention are attained will become readily apparent from the following description of a preferred embodiment thereof, shown by way of example, in the accompanying drawings, in which.

DETAILED DESCRIPTION

In the present invention, either an electrically conducting or insulating material may be used as the substrate. As a conducting substrate, of a metal or an alloy such as aluminum or stainless steel may be used. As an insulating substrate, a synthetic resin film sheet of material such as polyester, polyethylene, polycarbonate, polysterene, or polyamide, or a sheet, glass, ceramic, paper or the like may be used. In the case of using an insulating substrate, it is necessary to give a conduction treatment to at least the surfaces which make electrically contact with other layers. Such a conduction treatment can be accomplished by evaporation, sputtering or laminating a metal film to be employed as the conducting substrates. The substrates can take on an arbitrary shape such as cylindrical, belt-like or plate-like. Further, the substrate may have a multilayer structure. The thickness of the substrate may be selected suitably depending upon the electrophotographic photoreceptor needed, but normally a thickness of greater than 10 μm is appropriate.

On the substrate, there are formed a photosensitive layer consisting of a charge transporting layer and a charge generating layer, but the order of formation of the two layers is immaterial.

The charge transporting layer in the present invention is composed of aluminum oxide as a component, but essentially has no light sensitivity in the visible ray region. No light sensitivity in that region means that positive hole-electron pairs are not generated under the irradiation of a light with wavelength in the visible region. This charge transporting layer has a constitution that is completely different from the electrophotographic photosensitive layers obtained by dispersing ZnO and $TiO_2$, along with sensitizing coloring materials, in a resin binder. The electrophotographic sensitive layers may also be obtained by laminating an evaporated film of a chalcogen compound such as Se, Se.Te, S, or the like, and an a-Si film, that have been proposed in the past. The charge transporting layer of the present invention may, however, be photosensitive to ultraviolet light.

Figure 1:
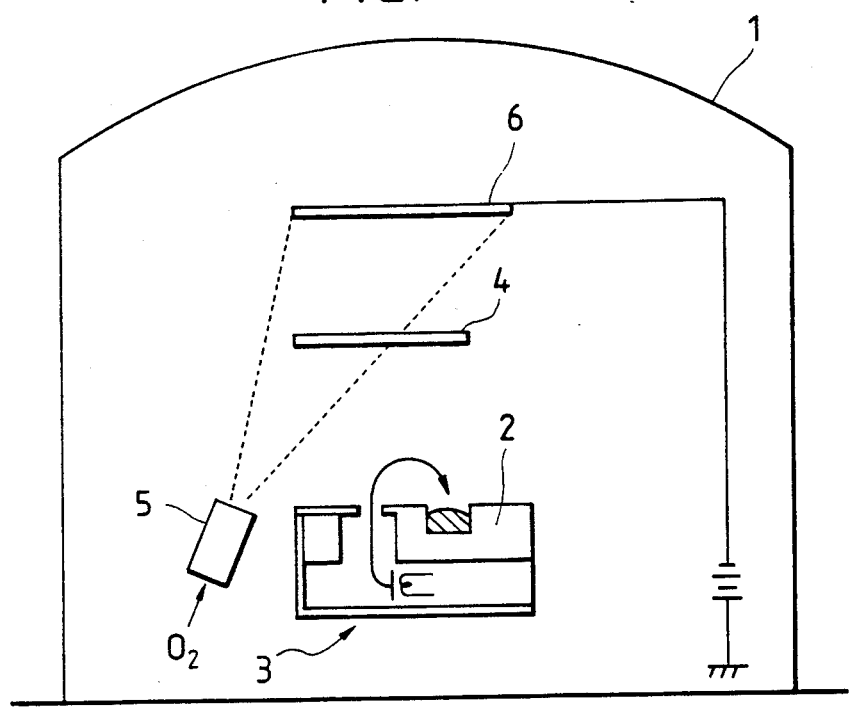
FIG. 1 is a schematic block diagram of an embodiment of an ion assisted deposition (IAD) apparatus used in the present invention.
Figure 2:
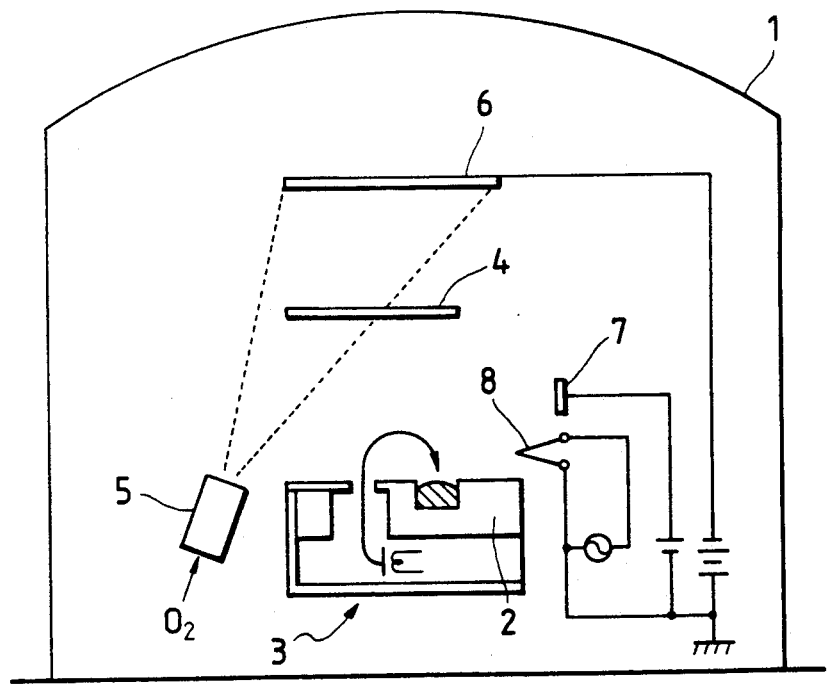
FIG. 2 is a schematic block diagram of another embodiment of the IAD apparatus used in the present invention.

The charge transporting layer of the present invention is formed by an IAD (Ion Assisted Deposition) method. Referring to FIG. 1, the IAD method will now be described. FIG. 1 shows a schamatic block diagram for the IAD apparatus used in the IAD method wherein a crucible 2, an electron gun 3, a shutter 4, and an ion gun 5 are arranged within a vacuum chamber 1, with a substrate 6 to be mounted in the upper part of the chamber. The electron gun, the ion gun, and the substrate are connected to a power supply to be supplied with predetermined voltages. In addition, the vacuum chamber is communicated with an exhaust system in order to maintain its inside at a predetermined vacuum level. Aluminum oxide or aluminum are inserted to the crucible 2, and electron beams are shot at it when an acceleration voltage is applied to the electron gun 3. Aluminum oxide or aluminum in the crucible are melted and evaporated by the electron beams and is accumulated on the substrate while being irradiated by ion beams of oxygen, argon, or the like from the ion gun 5.

Further, the IAD apparatus may be provided with an ionization electrode 7 and a thermoelectron radiating electrode 8 in order to enhance the efficiency of film formation or to improve the quality of the film deposited.

To give a concrete description of the formation of the charge transporting layer, first, aluminum oxide or aluminum as the raw material are placed in a water coolable oxyqene-free crucible provided within the vacuum chamber. At the same time, gas such as oxygen, argon, or the like as an ion source, is introduced directly into the vacuum chamber through the ion gun. In particular, when oxygen is employed as the ion source, there will be obtained significant effects for increasing the transparency of the film and for preventing the generation of cracks in the film and for preventing the generation of cracks in the film. With the case of using aluminum oxide as the raw material as an example, the conditions suitable for the formation of the film are: a vacuum within the vacuum chamber in the range of $10^{-5}$ to $10^{-7}$ Torr, acceleration voltage for the ion gun of 5 to 1000 V, acceleration current for the ion gun of 0.5 to 1000 mA, ion pulling-out voltage of $-0.5$ to $-300$ V, electron gun voltage of 0.5 to 20 kV, electron gun current of 0.5 to 1000 mA, and bias application voltage of 0 to $-2000$ V. Further, the substrate temperature is 50° C. or greater, preferably 100° to 500° C., and more preferably 200° to 300° C. When an ionization electrode is provided, the voltage applied to the ionization electrode is in the range of $+1$ to $+500$ V.

The thickness of the aluminum oxide film can be set appropriately by adjusting the time for IAD. The thickness of the charge transporting layer in the present invention is in the range of 2 to 100 μm, and more preferably 3 to 30 μm. As the charge generating layer use is made of a material with silicon as the principal component. Such a charge generating layer consisting of silicon as the principal component can be formed by the glow discharge decomposition method, sputtering method, ion plating method or vacuum deposition method. The film formation method can be selected appropriately depending upon the purpose, but the method in which silane ($SiH_4$) or a silane-based gas is decomposed by glow discharge decomposition method is preferred. By this method there is formed a film containing an appropriate amount of hydrogen, with relatively high dark resistance and high photosensitivity, making it possible to obtain characteristics desirable for a charge generating layer.

The method for forming a charge generating layer will be described in the following using the plasma CVD method, in which silane or a silane based gas is decomposited in a glow discharqe, as an example. As the raw material for manufacturing a charge generating layer having silicon as the principal component, silane or silane derivatives such as $SiH_4$, $Si_2H_6$, $SiCl_4$, $SiHCL_3$, $SiH_2Cl_2$, $Si(CH_3)_4$, $Si_3H_8$, or $Si_4H_{10}$ may be mentioned as examples. In addition, it is possible to use a carrier gas such as hydrogen, helium, argon or neon, as needed, at the time of forming a charge generating layer. Moreover, impurity elements such as boron (B) or phosphorus (P) may be added to the layer by mixing a dopant gas such as diborane ($B_2H_6$), phosphine (PH3) or the like for the purpose of controlling the dark resistance or of controlling the electrification polarity of the charge generating layer. Furthermore, halogen atoms, carbon atoms, oxygen atoms, nitrogen atoms or the like may be included within the charge generating layer for the purposes of enhancing the dark resistance, photosensitivity or charging capacity (charging capacity or charging potential per unit thickness of the film). Still further, it is possible to add such elements as germanium or tin for the purpose of increasing the sensitivity in the long wavelength region. In particular, the charge generating layer is desirable to contain silicon as the principal component and to include hydrogen of 1 to 40 atomic %, and preferably 5 to 20 atomic %. As for the film thickness, it is used in the range of 0.1 to 30 μm, and more preferably 0.2 to 5 μm.

In the electrophotographic photoreceptor of the present invention, there may be formed, as required, another layer adjacent to the upper or lower part of the photosensitive layer consisting of a charge generating layer and a charge transporting layer. As such a layer, one may mention the following.

As a charge injection preventing layer, there may be mentioned a p-type semiconductor layer or an n-type semiconductor layer obtained, for instance, by adding an element from group III or group V of the periodic table of the atoms to amorphous silicon, or an insulation layer of silicon nitride, silicon carbide, silicon oxide, amorphous carbon or the like. Further, as an adhesive layer, there may be mentioned a layer obtained by adding nitrogen, carbon, oxygen or the like to amorphous silicon. Besides the above, layers which can control the electrical and image characteristics of the photosensitive body, such as a layer containing simultaneously elements from the group IIIB and the group V of the periodic table of atoms, may be mentioned. The thickness of such a film can be determined arbitrarily, but normally it is used by setting it in the range of 0.01 to 10 $\mu$m.

Furthermore, a surface protection layer for preventing degeneration of the surface of the photoreceptor caused by the corona ions may be provided.

These layers may be formed by the plasma CVD method. As mentioned in conjunction with the charge generating layer, for adding impurity elements, gasified substances containing such impurities are introduced into the plasma CVD apparatus together with silane gas, and decomposition by glow discharge is carried out. As for the means of film formation, either DC discharge and AC discharge can be adopted equally effectively. With the case of using AC discharge as an example, the conditions for film formation are as follows. Namely, the frequency is in the range of 0.1 to 30 MHz, preferably 5 to 20 MHz, and the degree of vacuum during discharge is 0.1 to 5 Torr (13.3 to 667 Pa) with the substrate heating temperature of 100° to 400° C. It is considered that the oxide film possesses a function to permit the charge carriers generated in the adjacent charge generating layer to be injected without trapping them at the interface and at the same time to prevent unwanted injection of charges from the substrate side.

Because of this, it gives rise to an electrophotographic photoreceptor with charging capacity of greater than about 50 V/$\mu$m and a low rate of dark decay on the order of 5-15%/sec.

Further, in the present invention, a charge transporting layer consisting of aluminum oxide is formed by means of the IAD method, and the charge transporting layer thus obtained shows no generation of cracks.

EXAMPLE

The method of the present invention is further described by means of the following examples.

An aluminium oxide layer was formed on an aluminum substrate by the IAD method. Namely, alumina with a purity of 99.99% was provided in a water-cooled crucible made of oxygen free copper, and the vacuum within the vacuum chamber was kept at $7 \times 10^{-6}$ Torr. The vacuum degree was brought to $1 \times 10^{-4}$ Torr by the introduction of oxygen gas through the ion gun. The aluminum substrate was heated to 250° C., and the power supply of electron gun was adjusted to have a current of 180 mA by the application of an acceleration voltage of 6.5 kV. On the other hand, an acceleration voltage of 500 V was applied to the ion gun to obtain an ion gun current of 280 mA. In addition, an ion pulling-out voltage of $-50$ V was applied. Furthermore, a bias voltage of $-500$ V was applied to the aluminum substrate.

Figure 3:
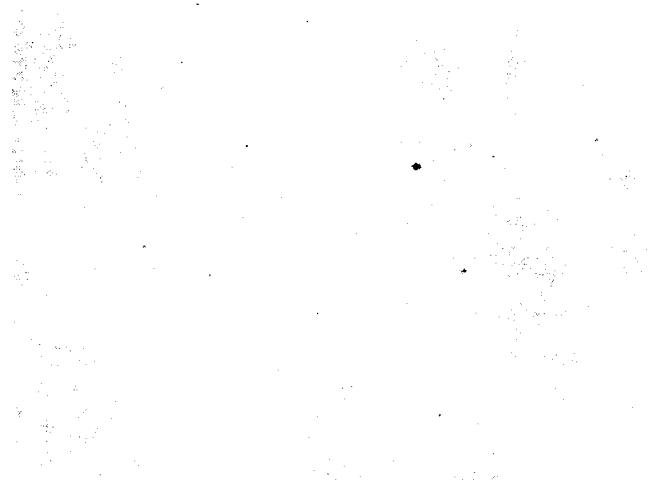
FIG. 3 is a microscope photograph showing the metallographic constitution of the surface of the aluminum oxide layer in the embodiment according to the present invention.

After formation of a film for about 120 min with the above-mentioned set-up, the sample was taken out by breaking the vacuum of chamber and a transparent film was obtained. The thickness of the aluminum oxide film was 65 $\mu$m. The surface of the charge transporting layer thus obtained showed absolutely no cracks. A microscope photograph (magnification: $\times 40$) of this film is shown in FIG. 3.

Subsequently, an a-Si:H film (nondoped) was formed on the charge transporting layer to a thickness of 1 $\mu$m. Namely, silane gas, SiH$_4$, was introduced into a capacitively coupled typed plasma CVD apparatus at the rate of 250 cc/min to bring the pressure to 1.0 Torr. The temperature of the substrate was 250° C. A glow discharge decomposition was carried out for 10 min at an output of 300 W with high frequency of 13.56 MHz.

A corona charging of the electrophotographic photoreceptor carried out while it was turned at a speed of 40 rpm showed a surface potential of about $-400$ V at 0.1 sec after the corona charging at corona current of $-20$ $\mu$A/cm to the photoreceptor. The light energy required for a half decay of the initial surface charges for an exposure to a monochromatic radiation with wavelength of 550 nm was 7.9 erg/cm$^2$, and the residual potential was about $-70$ V. Further, the rate of dark decay was 12%/sec.

A picture formed by inserting this photoreceptor into a Model No. 35000 plain paper copying machine made by Fuji Xerox Co., Ltd. showed no fogging and no defects.

COMPARATIVE EXAMPLE

Figure 4:
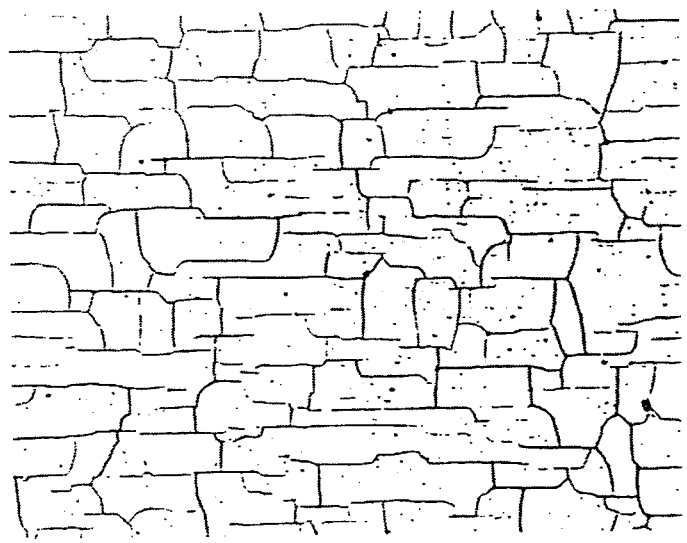
FIG. 4 is a microscope photograph showing the metallographic constitution of the surface of the aluminum oxide layer of a comparative example.

An aluminum oxide layer of about 6.5 $\mu$m was formed in a manner analogous to the example described above except that the ion gun was not operated. When the sample was taken out of the reaction chamber, numerous cracks were observed on the surface of the aluminum oxide layer formed. A microscope photograph (magnification: $\times 40$) of this film is shown in FIG. 4.

When an a-Si: H film was formed on the surface of the aluminum oxide layer with cracks, the electrophotographic photoreceptor obtained shown a generation of nonuniformity of chargeability due to the cracks in the aluminum oxide layer, and a picture copied by using the photoreceptor revealed defects in the picture.

As described in the foregoing, in the electrophotographic photoreceptor of the present invention, the charge transporting layer consisting of aluminum oxide is formed by means of the IAD method so that even when an aluminum substrate is used as the substrate, there will be absolutely no generation of cracks in the charge transporting layer formed. Accordingly the electrophotographic photoreceptors of the present invention have a uniform charging characteristics, and hence, a copied picture formed by the use of the photoreceptor shows an excellent picture quality with no defects in it.

Various modifications will become possible to those skilled in the art after receiving the teachings of the present disclosure without departing from the scope thereof.

What is claimed is:

1. A method for preparing an electrophotographic photoreceptor comprising the steps of:

forming by means of an ion assisted deposition method employing oxygen gas as the ion source, a charge transporting layer comprising aluminum oxide and having a thickness in the range of 2 to 100 microns; and forming on said charge transporting layer a charge generating layer having amorphous silicon as the principal component.

2. A method for preparing an electrophotographic photoreceptor as claimed in claim 1, wherein said charge generating layer is formed with a thickness in the range of 0.1 to 30 microns.

3. A method for preparing an electrophotographic photoreceptor as claimed in claim 1, wherein said charge generating layer is formed with a thickness in the range of 0.5 to 5 microns.

4. A method for preparing an electrophotographic photoreceptor as claimed in claim 1, wherein said charge transporting layer is formed with a thickness in the range of 3 to 30 microns.

5. A method for preparing an electrophotographic photoreceptor comprising the steps of:

forming a charge generating layer having amphorous silicon as the principal components; and forming on said charge generating layer, by means of an ion assisted deposition method employing oxygen as the ion source, a charge transporting layer comprising aluminum oxide and having a thickness in the range of 2 to 100 microns.

6. A method for preparing an electrophotographic photoreceptor as claimed in claim 5, wherein said charge generating layer is formed with a thickness in the range of 0.1 to 30 microns.

7. A method for preparing an electrophotographic photoreceptor as claimed in claim 5, wherein said charge generating layer is formed with a thickness in the range of 0.5 to 5 microns.

8. A method for preparing an electrophotographic photoreceptor as claimed in claim 5, wherein said charge transporting layer is formed with a thickness in the range of 3 to 30 microns.

* * * * *